United States Patent
Pomarede et al.

(10) Patent No.: US 7,022,613 B2
(45) Date of Patent: *Apr. 4, 2006

(54) REDUCED CROSS-CONTAMINATION BETWEEN CHAMBERS IN A SEMICONDUCTOR PROCESSING TOOL

(75) Inventors: Christophe Pomarede, Phoenix, AZ (US); Eric J. Shero, Phoenix, AZ (US); Olli Jylhä, Espoo (FI)

(73) Assignee: ASM America, Inc., Phoenix, AZ (US)

( * ) Notice: Subject to any disclaimer, the term of this patent is extended or adjusted under 35 U.S.C. 154(b) by 156 days.

This patent is subject to a terminal disclaimer.

(21) Appl. No.: 10/786,779

(22) Filed: Feb. 24, 2004

(65) Prior Publication Data

US 2004/0166683 A1 Aug. 26, 2004

Related U.S. Application Data

(63) Continuation of application No. 10/441,642, filed on May 20, 2003, now Pat. No. 6,797,617.

(60) Provisional application No. 60/382,204, filed on May 21, 2002.

(51) Int. Cl.
  *H01L 21/302* (2006.01)
(52) U.S. Cl. ............ 438/706; 438/714; 156/345; 118/719
(58) Field of Classification Search .......... 438/689, 438/706, 714, 715, 729; 156/345; 216/67; 118/719, 723
See application file for complete search history.

(56) References Cited

U.S. PATENT DOCUMENTS

| | | | |
|---|---|---|---|
| 4,828,224 A | 5/1989 | Crabb et al. | |
| 4,889,609 A | 12/1989 | Cannella | |
| 5,186,718 A | 2/1993 | Tepman et al. | |
| 5,286,296 A * | 2/1994 | Sato et al. | 118/719 |
| 5,601,686 A * | 2/1997 | Kawamura et al. | 438/689 |
| 5,609,689 A | 3/1997 | Kato et al. | |
| 5,611,655 A | 3/1997 | Fukasawa et al. | |
| 5,647,945 A * | 7/1997 | Matsuse et al. | 156/345.38 |
| 5,651,868 A | 7/1997 | Canady et al. | |
| 5,784,799 A | 7/1998 | Tsubone et al. | |
| 5,785,796 A | 7/1998 | Lee | |
| 5,810,942 A | 9/1998 | Cavaliere et al. | |
| 5,820,692 A | 10/1998 | Baecker et al. | |
| 5,913,978 A | 6/1999 | Kato et al. | |
| 5,934,856 A * | 8/1999 | Asakawa et al. | 414/217 |

(Continued)

FOREIGN PATENT DOCUMENTS

WO  WO 01/04935  1/2001

*Primary Examiner*—Kin-Chan Chen
(74) *Attorney, Agent, or Firm*—Knobbe Martens Olson & Bear LLP (57) ABSTRACT

In accordance with one aspect of the present invention, a method is provided for transporting a workpiece in a semiconductor processing apparatus comprising a transfer chamber, a process chamber, and a gate valve between the transfer chamber and the process chamber. The method comprises vacuum pumping the transfer chamber to achieve a first pressure in the transfer chamber and vacuum pumping the process chamber to achieve a second pressure in the process chamber. An inert gas is flowed into the transfer chamber and shut off in the process chamber. The transfer chamber is isolated from pumping, but pumping continues from the process chamber. The gate valve is opened after isolating the transfer chamber from pumping. The workpiece is then transferred between the transfer chamber and the process chamber. A definitive flow direction from transfer chamber to process chamber is thereby achieved, minimizing risk of back-diffusion.

20 Claims, 4 Drawing Sheets

U.S. PATENT DOCUMENTS

| | | | |
|---|---|---|---|
| 5,981,399 A * | 11/1999 | Kawamura et al. | 438/715 |
| 6,042,623 A | 3/2000 | Edwards | |
| 6,048,154 A | 4/2000 | Wytman | |
| 6,106,634 A | 8/2000 | Ghanayem et al. | |
| 6,224,312 B1 | 5/2001 | Sundar | |
| 6,224,679 B1 | 5/2001 | Sasaki et al. | |
| 6,286,230 B1 | 9/2001 | White et al. | |
| 6,312,525 B1 | 11/2001 | Bright et al. | |
| 6,488,778 B1 | 12/2002 | Ballantine et al. | |
| 6,536,136 B1 | 3/2003 | Saga | |
| 6,828,235 B1 * | 12/2004 | Takano | 438/680 |
| 2001/0000759 A1 * | 5/2001 | Doley et al. | 438/488 |
| 2002/0020344 A1 * | 2/2002 | Takano | 118/100 |

* cited by examiner

| GATE VALVE | TRANSFER CHAMBER PURGE | TRANSFER CHAMBER PUMP | PROCESS CHAMBER PURGE | PROCESS CHAMBER PUMP |
|---|---|---|---|---|
| CLOSED | ON | ON | ON | ON |
| OPEN | ON | OFF | OFF | ON |

REDUCED CROSS-CONTAMINATION BETWEEN CHAMBERS IN A SEMICONDUCTOR PROCESSING TOOL

REFERENCE TO RELATED APPLICATION

This application is a continuation of U.S. Ser. No. 10/441,642, filed May 20, 2003, issued Sep. 28, 2004 as U.S. Pat. No. 6,797,617, and claims priority benefit under 35 U.S.C § 119(e) to U.S. provisional application No. 60/382,204, filed May 21, 2002.

FIELD OF THE INVENTION

The present invention relates to semiconductor processing tools and, in particular, to methods of minimizing cross-contamination during transport of the wafers between chambers of such tools.

BACKGROUND OF THE INVENTION

Cluster tools used in the semiconductor processing of wafers or other workpieces typically comprise a central wafer handling chamber, or transfer chamber, surrounded by a number of process chambers within which various processes are carried out on the wafers (e.g., deposition, etching, doping, annealing and oxidizing). A robot is provided in the transfer chamber for moving the wafers within the cluster tool. The transfer chamber is typically isolated from each of the process chambers by gate valves. The gate valves can be opened to allow the robot to transfer the wafers between the transfer chamber and the process chambers.

For reduced pressure processing, transfer of wafers between the transfer chamber and the process chambers can be carried out at reduced pressure, thereby eliminating the need to pump down the process chamber after each wafer transfer and increasing wafer throughput. It is important to prevent cross-contamination between the chambers during wafer transfer. Gaseous (homogeneous) cross-contamination takes place when gases from one chamber are convectively or diffusively transported to another chamber, thereby contaminating the other chamber. For example, an oxidizing species used to grow a silicon dioxide or oxynitride film in one process chamber could contaminate another process chamber in which an oxygen-free environment is desired, such as for epitaxial deposition. Additionally, particulate (heterogeneous) particulate can also arise during wafer transfer.

In the past, attempts have been made to control the flow of gases between the chambers, and thereby reduce gaseous cross-contamination, by creating a pressure differential between the transfer chamber and the process chamber to be accessed prior to opening the gate valve therebetween. The intent is that, when the gate valve is opened, the gases will flow from the higher pressure chamber to the lower pressure chamber to prevent contamination of the higher pressure chamber. Various pump systems have been devised for creating pressure differentials between the chambers.

One problem with such systems is that creating a pressure differential between the chambers does not necessarily ensure that the desired gas flow will occur upon opening of the gate valve. This is due in part to the dependence of the pressure differential-induced flow on the absolute pressures in the chambers. In addition, a back flow or back diffusion of the gases into the (initially) higher pressure chamber can occur upon opening of the gate valve.

DESCRIPTION OF THE RELATED ART

SUMMARY OF THE INVENTION

The present method ensures the occurrence of the desired flow between the transfer chamber and the process chamber(s) upon opening of the gate valve(s) between the chambers.

In accordance with one aspect of the present invention, a method is provided for transporting a workpiece in a semiconductor processing apparatus comprising a transfer chamber, a process chamber, and a gate valve between the transfer chamber and the process chamber. The method comprises operating a first pump connected to the transfer chamber to achieve a first pressure in the transfer chamber and operating a second pump connected to the process chamber to achieve a second pressure in the process chamber. An inert gas is flowed into the transfer chamber. The first pump is isolated from the transfer chamber. The gate valve is opened while the first pump is isolated from the transfer chamber and the second pump continues to operate. The workpiece is then transferred between the transfer chamber and the process chamber.

In accordance with another aspect of the present invention, a method is provided for transporting a workpiece in a semiconductor processing apparatus comprising a transfer chamber, a process chamber, and a gate valve between the transfer chamber and the process chamber. The method comprises vacuum pumping to achieve a lower pressure in the process chamber than in the transfer chamber. An inert gas is flowed into the transfer chamber. An inert gas is also flowed into the process chamber. The flow of inert gas into the process chamber is discontinued. The gate valve is opened after discontinuing the flow of inert gas into the process chamber while continuing to flow inert gas into the transfer chamber. The workpiece is then transferred between the transfer chamber and the process chamber.

In accordance with another aspect of the present invention, a method of transporting a workpiece in a semiconductor processing apparatus is provided. The method comprises pumping a first chamber of the processing apparatus to achieve a first pressure in the first chamber and pumping a second chamber of the processing apparatus to achieve a second pressure in the second chamber. An inert gas is flowed into the first chamber. A gate valve located between the first chamber and the second chamber is opened. The pumping of the first chamber is discontinued prior to opening the gate valve and while the gate valve is opened. The workpiece is then transferred between the first chamber and the second chamber.

In accordance with another aspect of the present invention, a method is provided for transporting a workpiece in a semiconductor processing apparatus comprising a transfer chamber, a process chamber, and a gate valve between the transfer chamber and the process chamber. The method comprises vacuum pumping to achieve a lower pressure in the process chamber than in the transfer chamber. An inert gas is flowed into the transfer chamber. An inert gas is also flowed into the process chamber. The gate valve is opened while continuing to operate the at least one pump. The flow of inert gas into the process chamber is kept off while the gate valve is opened. The workpiece is then transferred between the transfer chamber and the process chamber.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

DETAILED DESCRIPTION OF THE PREFERRED EMBODIMENT

While not separately illustrated in the figures, it will be understood that the process steps disclosed herein can be programmed into a process tool controller that is electrically connected to control gas flow valves, mass flow controllers, gate valve actuators, substrate transfer robots, etc. The skilled artisan will readily appreciate that an apparatus can be provided with software programming or hard wiring to achieve the desired processing steps described herein.

Figure 1:
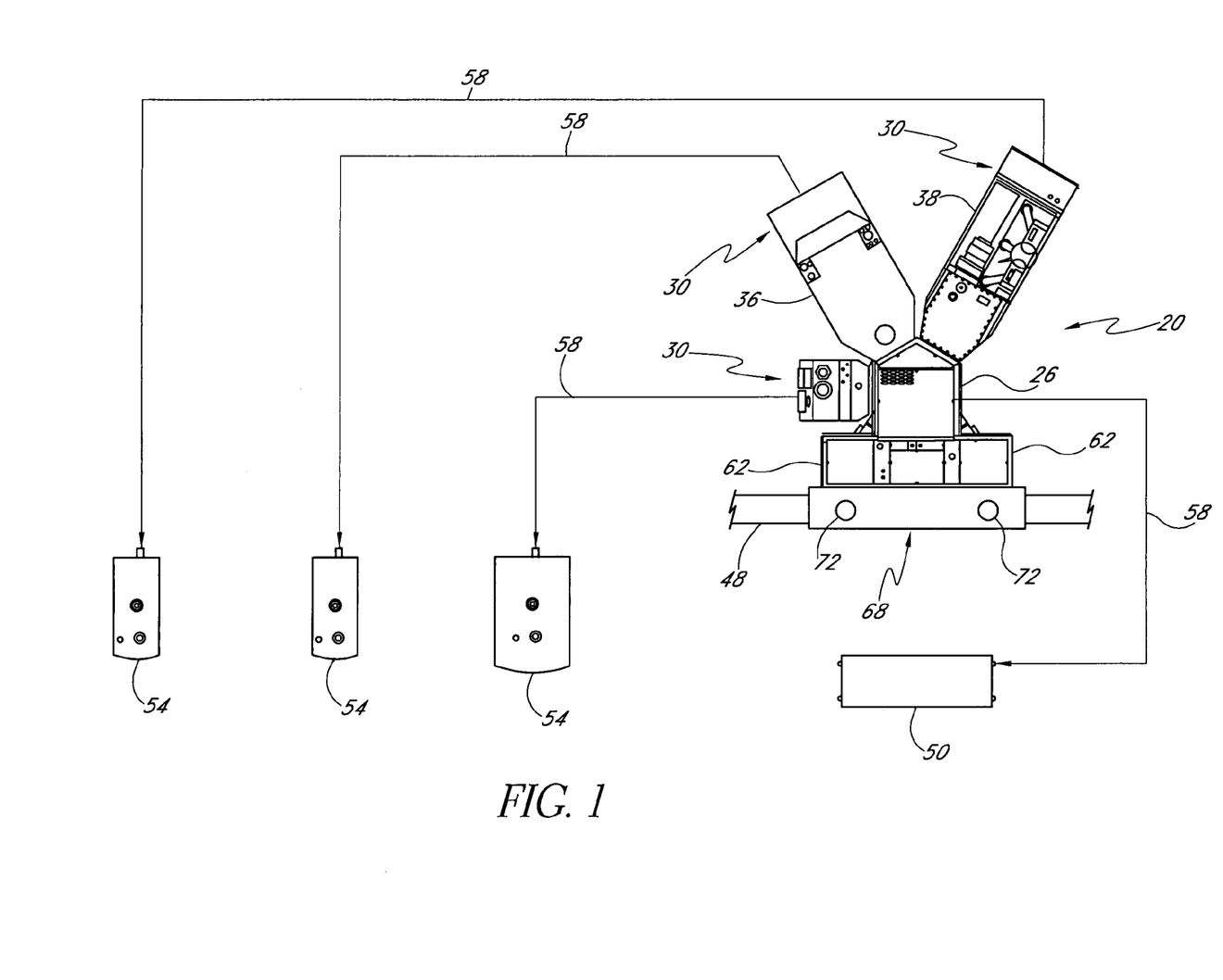
FIG. 1 is a top plan view of a wafer processing apparatus in accordance with a preferred embodiment of the present invention.

With reference initially to FIG. 1, an exemplary semiconductor processing apparatus 20 is illustrated, comprising a central substrate or workpiece handling chamber, or referred to herein as a transfer chamber 26, connected to at least one process chamber. FIG. 1 shows the handling chamber 26 surrounded by a number of process chambers 30. In the illustrated embodiment, the semiconductor processing apparatus 20 is adapted for use in CMOS gate stack applications. The process chambers 30 comprise a hydrogen fluoride (HF) vapor clean chamber 34, a silicon nitride chemical vapor deposition (CVD) chamber 36, and an atomic layer deposition (ALD) chamber 38. It is to be understood, however, that the semiconductor processing apparatus 20 illustrated in FIG. 1 is merely exemplary. In alternative embodiments, the apparatus 20 can include a greater or lesser number of process chambers 30. For example, the apparatus 20 can include only one process chamber 30 connected to the transfer chamber 26, or can include more than the illustrated three process chambers 30. In addition, the apparatus 20 can be configured to perform additional or other types of processes, and can be configured to carry out the same process in two or more of the process chambers 30.

The semiconductor processing apparatus 20 of the illustrated embodiment has a modular design and meets Semiconductor Equipment and Materials International (SEMI) standardization requirements for convenient interconnection between the transfer chamber 26 and the process chambers 30. Each of the process chambers 30 is isolated from the transfer chamber 26 by a gate valve 40 (see FIG. 2). The gate valves 40 can be opened to allow the transfer of a semiconductor wafer or other workpiece between the transfer chamber 26 and the process chambers 30 by a workpiece handling robot 46 (see FIG. 2) located within the transfer chamber 26.

In the illustrated embodiment, to minimize particle contaminants, the transfer chamber 26 and process chambers 30 are preferably situated within a gray room defined by a gray room wall 48. A first or transfer chamber vacuum pump 50 is provided, either within the gray room or in a clean room on the opposite side of the gray room wall 48. In other arrangements, no clean room or gray room is provided. In the illustrated embodiment, a second or process chamber vacuum pump 54 is provided for each of the process chambers 30. The transfer chamber pump 50 and process chamber pumps 54 selectively communicate with the transfer chamber 26 and the process chambers 30, respectively, via conductance lines 58 to regulate the pressures in the chambers 26, 30. In alternative embodiments, however, a greater or lesser number of pumps can be provided to service the transfer chamber 26 and the process chambers 30. For example, a single pump may service more than one chamber through various valved conductance lines, or more than one pump may comprise a pump "bank" for servicing a single chamber. Although not shown, it will be understood that each of the process chambers 30 is connected to a source of purge gas and reactant gas(es) and that the transfer chamber 26 is also connected to a source of purge gas 80 (see FIG. 2). Thus, a gas distribution system includes purge gas inlets in each of the process chambers 30 and in the transfer chamber 26.

With reference still to FIG. 1, a load lock chamber 62 is provided at a front end of the transfer chamber 26. The illustrated embodiment includes two load lock chambers 62. Alternatively, however, a single load lock chamber 62 or more than two load lock chambers 62 could be provided. The load lock chambers 62 are isolated from the transfer chamber 26 by gate valves (not shown). In the illustrated embodiment, a loading platform 68 is provided in front of the load lock chambers 62 to automatically load wafers from cassettes (not shown), or load the cassettes themselves, into the load lock chambers 62. The loading platform 68 of the illustrated embodiment includes two shuttles 72, each of which can accommodate up to two cassettes. Preferably, the cassettes are standard front-opening unified pod ("FOUPs"), which provide closed environments for the wafers. The cassettes can be empty to receive wafers, or can contain from one to twenty-five wafers to be processed.

To operate the wafer processing apparatus 20, a user enters a process recipe into a controller (not shown). The process recipe may include instructions regarding process sequences, process times, process temperatures, pressures and gas flows. In an exemplary process, one of the shuttles 72 positions a cassette in front of one of the load lock chambers 62. The load lock chamber 62 is then back-filled to atmospheric pressure. The load lock chamber 62 is opened, and a cluster platform robot (not shown) transfers the wafers from the cassette or transfers the cassette itself from the shuttle 72 to the load lock chamber 62. The load lock chamber 62 is then closed and evacuated.

The gate valve between the active load lock chamber 62 and the transfer chamber 26 is opened to allow the workpiece handling robot within the transfer chamber 26 to access the cassette. The workpiece handling robot extends into the load lock chamber 62 and removes a workpiece (e.g., wafer) from the load lock chamber 62. The gate valve is then closed, and the robot moves the wafer towards the process chamber 30 to be accessed.

Figure 2:
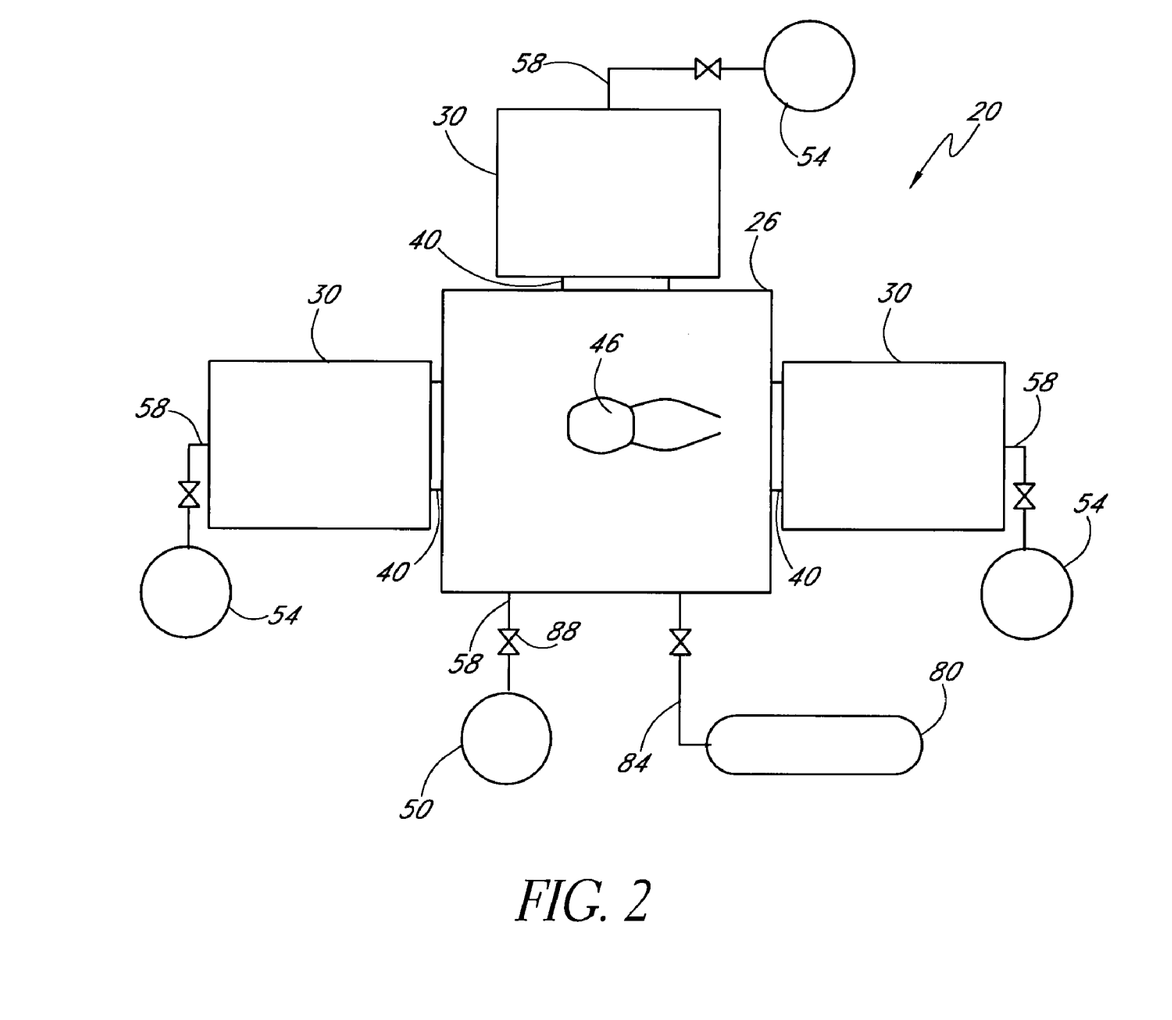
FIG. 2 is a simplified schematic view of the wafer processing apparatus of FIG. 1.

With reference now to FIG. 2, prior to opening the gate valve 40 between the transfer chamber 26 and one of the process chambers 30, the transfer chamber pump 50 and the pump 54 of the process chamber 30 to be accessed are operated, as necessary, to achieve a slightly lower pressure in the process chamber 30 than in the transfer chamber 26. Preferably, the pressure in the process chamber 30 prior to opening the gate valve 40 is slightly below its operating value during processing. In this manner the process chamber 30 is backfilled to process pressure during wafer transfer, as will be understood in view of the disclosure below. The skilled artisan will appreciate, however, that the lower pressure in the process chamber 30 compared to the transfer chamber 26 can be provided in any desired manner. The pressure differential between the process chamber 30 and the transfer chamber 26 is preferably low enough to avoid generating a significant pressure wave upon opening of the gate valve 40, which could stir particle contaminants in the processing apparatus 20. The optimum pressure differential will depend upon a number of different factors, including the particular design of the apparatus 20. Preferably, the pressure differential is between about 100 mTorr and 5 Torr. In a typical reduced-pressure workpiece transfer, however, a pressure differential between the process chamber 30 and the transfer chamber 26 of about 100 mTorr to 300 mTorr has been shown to be advantageous. More preferably, the pressure differential between the process chamber 30 and the transfer chamber 26 is about 100 mTorr to 150 mTorr. Thus, for example, if the pressure in the process chamber 30 prior to opening the gate valve 40 is about 200 mTorr, the pressure in the transfer chamber 26 is preferably between about 300 mTorr and 500 mTorr, and more preferably between about 300 mTorr and 350 mTorr. In another arrangement, the process chamber 30 is pumped to about 1 Torr prior to opening the gate valve 40, the pressure in the transfer chamber 26 is preferably about 3 Torr, such that the pressure differential is about 2 Torr.

When the desired pressures are obtained in the transfer chamber 26 and the process chamber 30 to be accessed, an inert or non-reactive gas (also known as purge or sweep gas), such as nitrogen ($N_2$), is flowed into the transfer chamber 26 from a gas source 80 via a gas line 84. Alternatively, the inert gas may already be flowing into the transfer chamber 26 during pumping of the transfer chamber 26 and the process chamber 30 to reach the desired pressures in the chambers 26, 30, in which case the flow of inert gas into the transfer chamber 26 may be continued. Inert gas is often flowed in semiconductor process reactors to exclude oxygen, moisture and particulates. The gate valve 40 between the transfer chamber 26 and the process chamber 30 is then opened, while the pump 54 of the process chamber 30 continues to operate. Preferably, the inert gas flow is initiated in the transfer chamber 26 at least 2 seconds, and more preferably at least 10 seconds prior to opening the gate valve 40 to the process chamber, and most preferably inert gas flow in the transfer chamber 26 continues while the gate valve is opened.

As the gate valve 40 is opened, the transfer chamber pump 50 preferably is isolated from the transfer chamber 26. The pump 50 can be isolated simultaneously with opening. More preferably, the gate valve 40 is opened at least 1 second after isolating the transfer chamber pump 50 from the transfer chamber 26, and most preferably the gate valve 40 is opened between about 2 seconds and 5 seconds after isolating the transfer chamber pump 50. The isolation of the transfer chamber pump 50 may be accomplished, for example, by closing a valve 88 in the conductance line 58 between the transfer chamber 26 and the transfer chamber pump 50, by turning off the pump 50, reducing the pump 50 speed, on diverting the suction to another path.

Preferably, no inert gas is flowing within the process chamber 30 upon the opening of the gate valve 40 between the transfer chamber 26 and the process chamber 30. The process chamber 30 is typically purged of reactant and by-product gases with inert gas after processing in the chamber 30 is stopped. Thus, if the inert gas is flowing into the process chamber 30, it should be affirmatively discontinued as the gate valve 40 is opened. Preferably, the gate valve 40 is opened after discontinuing the flow of inert gas into the process chamber 30. More preferably, the gate valve 40 is opened at least 1 second after discontinuing the flow of inert gas into the process chamber 30, and most preferably the gate valve 40 is opened between about 2 seconds and 10 seconds after discontinuing the purge flow within the process chamber 30. It will be understood that, while no inert gas is directly provided to the process chamber 30 by way of an inert gas inlet opening to the process chamber 30 when the gate valve 40 is opened, inert gas is indirectly provided to the chamber by way of flow from the transfer chamber 26 when the gate valve 40 is opened, as explained in more detail in the paragraph below.

In accordance with the preferred embodiments, a definable convective flow of inert gas from the transfer chamber 26 to the process chamber 30 is generated upon the opening of the gate valve 40 between the chambers 26, 30. The robot 46 then transports the wafer into the process chamber 30, and the gate valve 40 is closed. Rather than merely creating a pressure differential, the purge and pump state shown in FIG. 3 creates a definable flow of inert gas from the transfer chamber 26 to the process chamber 30 upon opening of the gate valve 40. Thus, the potential for contamination of the transfer chamber 26 by contaminants in the process chamber 30 is minimized. The velocity of the gas flow between the chambers 26, 30 can be adjusted, as desired, by operating a mass flow controller located in the gas line 84 between the transfer chamber 26 and the inert gas source 80.

In a particularly preferred embodiment, an inert gas curtain is generated at the transfer chamber side of the gate valve 40 between the transfer chamber 26 and each of the process chambers 30. The inert gas curtain preferably is generated by gas jets (not shown) directed towards the process chamber 30 along the perimeter wall of the gate valve 40, thereby reducing the boundary layer thickness of the inert gas at the perimeter wall. As a result, back flow of the inert gas into the transfer chamber 26 (along with any contaminants from the process chamber 30) is reduced. The amount of the inert gas flowed from the transfer chamber 26 to the process chamber 30 can also generally be reduced without adversely affecting contamination.

When the processing of the wafer in the process chamber 30 has been completed, the method described above is repeated prior to opening the gate valve 40 to remove the wafer from the process chamber 30. Thus, the transfer chamber pump 50 and the pump 54 of the process chamber 30 to be accessed are again operated, as necessary, to achieve a slightly lower pressure in the process chamber 30 than in the transfer chamber 26. In one embodiment, the pressure in the process chamber is actively controlled to be at a lower level than in the transfer chamber prior to opening the gate valve. Accordingly, inert gas flows directly into the transfer chamber 26 but flows only indirectly, through the gate valve 40, into the process chamber 30. When the desired pressures are obtained in the transfer chamber 26 and the process chamber 30 to be accessed, the inert gas is flowed or continued in the transfer chamber 26. The gate valve 40 between the transfer chamber 26 and the process chamber 30 is then opened, while the pump 54 of the process chamber 30 continues to operate. Preferably, at the time the gate valve 40 is opened, the transfer chamber pump 50 is isolated from the transfer chamber 26, and no inert gas flows into the process chamber 30. The pump 54 of the process chamber 30, however, continues to operate, and the inert gas continues to flow into the transfer chamber 26. The robot 46 transports the wafer out of the process chamber 30, and the gate valve 40 is closed. The wafer can then be transferred, as desired, to another process chamber 30, to a cooling station (not shown), or back to the cassette.

The method described herein may be carried out each time one of the gate valves 40 between the transfer chamber 26 and one of the process chambers 30 is opened. By creating a definable flow of inert gas from the transfer chamber 26 to the process chamber 30 upon opening of the gate valves 40 between the transfer chamber 26 and each of the process chambers 30, back flow and back diffusion of contaminants from the process chambers 30 to the transfer chamber 26 are minimized. As a result, the reactants or reaction products present in one process chamber 30 are prevented from entering the transfer chamber 26, from which they might subsequently contaminate other process chambers 30 or otherwise undesirably react with materials in the transfer chamber 26, causing, e.g., corrosion.

Figure 3:
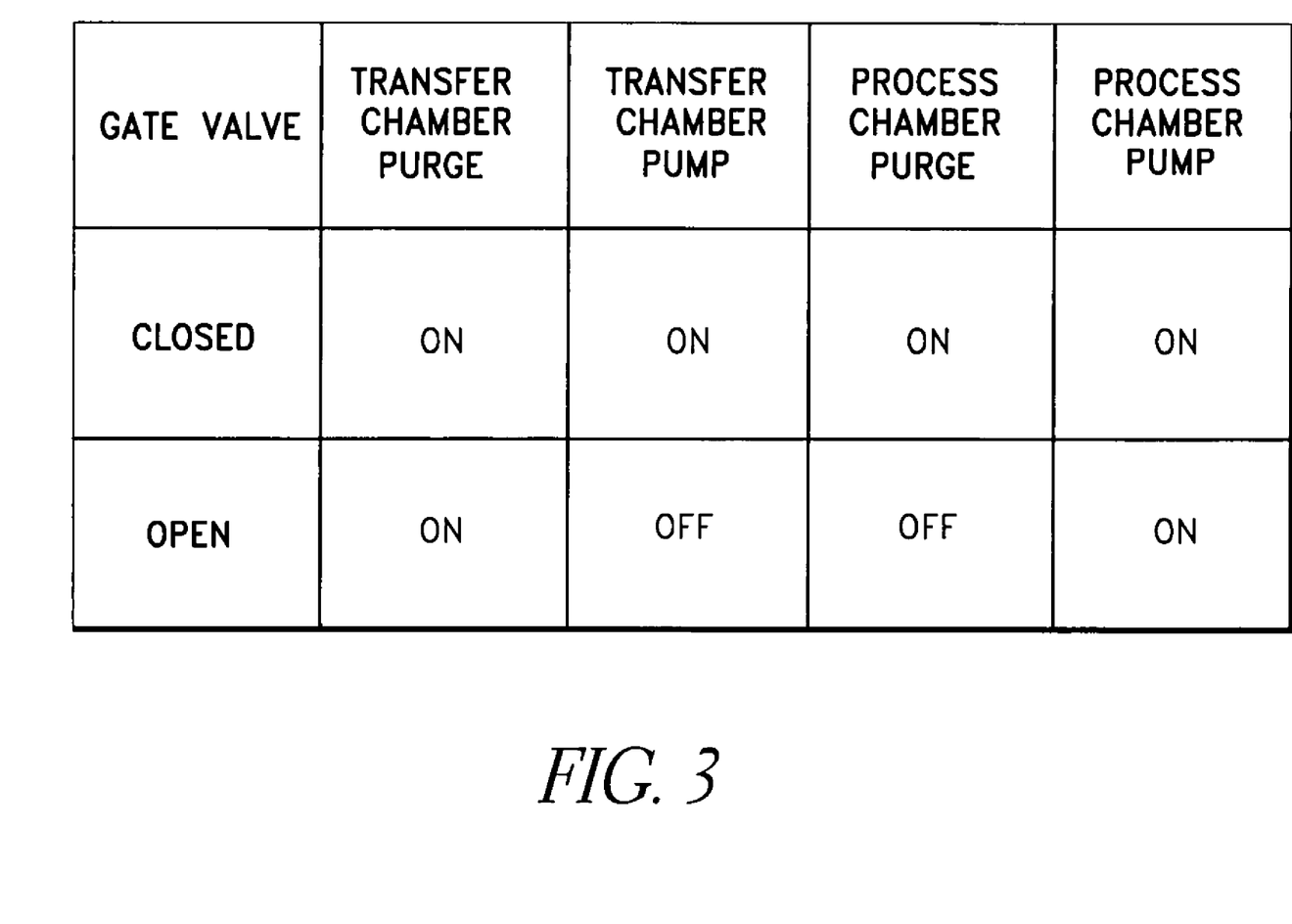
FIG. 3 is a chart illustrating the status of various components of the processing apparatus when the gate valve is opened or closed, in accordance with the preferred embodiment of the invention.
Figure 4:
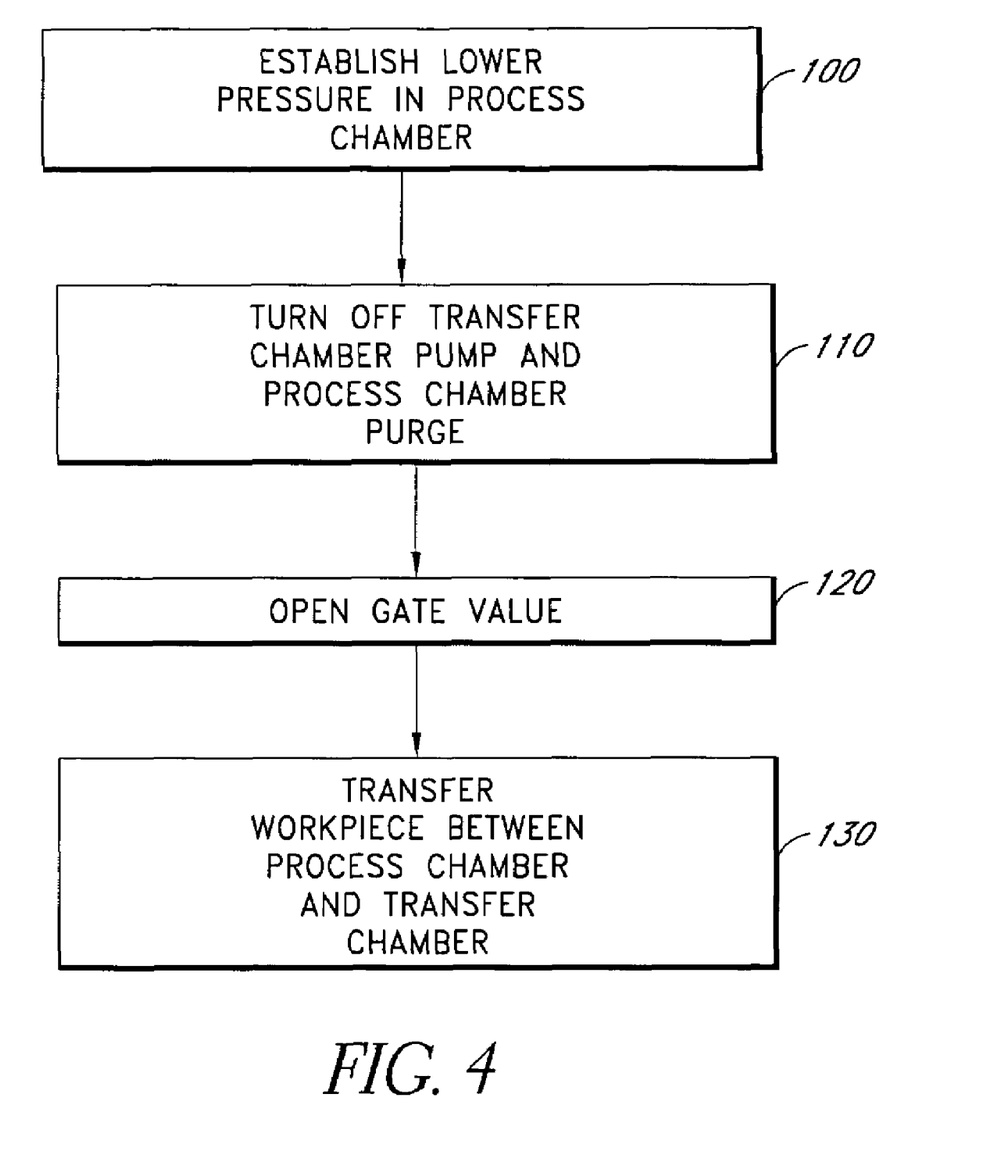
FIG. 4 is a flow chart illustrating a process of operating a semiconductor processing apparatus in accordance with a preferred embodiment of the present invention.

FIGS. 3 and 4 summarize the pump and purge status of the transfer and process chambers, relative to the gate valve opening and closing, according to the preferred embodiment of the present invention. As illustrated in FIG. 4, while the gate valve is closed (and typically processing is being conducted inside the process chamber) conditions are established 100 such that a lower pressure is present in the process chamber as compared to the transfer chamber. This ensures an initial flux of gases in the direction of the process chamber upon opening of the gate valve. When a transfer of substrates or workpieces is desired, the controls are programmed to first turn OFF 110 the transfer chamber pump and the process chamber purge. As indicated in FIG. 3, preferably the transfer chamber purge and the process chamber pump are maintained in their ON conditions. Preferably, enough time passes to allow the system to stabilize to avoid turbulent flow upon opening the gate valve. The gate valve is then opened 120. Because purge gas flow continues to flow in the transfer chamber, without any pumping action, and because purge gas has been turned OFF to the process chamber while the vacuum pump continues to pull gases through the process chamber, the purge gas has a definitive flow direction from the transfer chamber to the process chamber. This definitive flow direction minimizes risk of back diffusion of homogeneous or heterogeneous contaminants or residual reactants from the process chamber out to the transfer chamber.

Workpieces can then be transferred 130 between the process chamber and the transfer chamber. For example, a processed wafer can be removed from the process chamber, and a fresh wafer can be exchanged and placed inside the process chamber. Preferably, the fresh wafer is already present in the transfer chamber for this exchange, such that other gate valves do not need to be opened. For example, the transfer chamber can include a staging area for the fresh wafer and a cooling station for the processed wafer. In other arrangements, multiple robots, multiple end effectors, or multiple spots can be provided on a single robot to obviate the need for stations. In still other arrangements, a buffer or load lock is provided for wafers for performing exchange.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. For example, in alternative embodiments, the processing apparatus 20 might have only one or any other suitable number of process chambers 30 connected to the transfer chamber 26. It is further contemplated that various combinations and sub-combinations of the specific features and aspects of the embodiments may be made and still fall within the scope of the invention. For example, in some instances, it may be desirable to isolate the transfer chamber pump 50 prior to opening the gate valve 40 between the chambers 26, 30 and not discontinue the flow of inert gas to the process chamber 30. In other instances, for example, it may be desirable to discontinue the flow of inert gas to the process chamber 30 prior to opening the gate valve 40 between the chambers 26, 30 and not isolate the transfer chamber pump 50. Accordingly, it is intended that the scope of the present invention herein disclosed should not be limited by the particular disclosed embodiments described above, but should be determined only by a fair reading of the claims that follow.

What is claimed is:

1. A method of transporting a workpiece in a semiconductor processing apparatus comprising a transfer chamber, a process chamber, and a gate valve between the transfer chamber and the process chamber, the method comprising:
    flowing an inert gas into the process chamber while the gate valve is closed;
    turning off the inert gas flowing into the process chamber while the gate valve is closed;
    flowing an inert gas into the transfer chamber;
    opening the gate valve while flowing inert gas into the transfer chamber and while the flowing of inert gas into the process chamber remains off; and
    transferring the workpiece between the transfer chamber and the process chamber through the opened gate valve.

2. The method of claim 1, wherein flowing inert gas into the transfer chamber is initiated at least 2 seconds before opening the gate valve.

3. The method of claim 2, wherein flowing inert gas into the transfer chamber is initiated at least 10 seconds before opening the gate valve.

4. The method of claim 1, further comprising creating a pressure differential between the transfer chamber and the process chamber while the gate valve is closed.

5. The method of claim 4, wherein the pressure differential created is a lower pressure in the process chamber than in the transfer chamber.

6. The method of claim 5, wherein the pressure differential is between 5 mTorr and 100 mTorr.

7. The method of claim 5, therein the pressure differential is between 100 mTorr and 300 mTorr.

8. The method of claim 5, wherein the pressure differential is created by vacuum pumping the transfer chamber and vacuum pumping the process chamber.

9. The method of claim 8, wherein vacuum pumping the transfer chamber is discontinued prior to opening the gate valve.

10. A method of transporting a workpiece in a semiconductor processing apparatus, comprising:
   operating a first pump in fluid communication with a first chamber of the processing apparatus to achieve a first pressure in the first chamber;
   operating a second pump in fluid communication with a second chamber of the processing apparatus to achieve a second pressure in the second chamber;
   flowing an inert gas into the first chamber;
   opening a gate valve positioned between the first chamber and the second chamber while flowing inert gas into the first chamber;
   isolating the first pump from the first chamber prior to opening the gate valve; and
   transferring the workpiece through the gate valve between the first chamber and the second chamber.

11. The method of claim 10, wherein the first pressure is greater than the second pressure.

12. The method of claim 11, wherein the second pressure is below the operating pressure in the second chamber during processing of the workpiece.

13. The method of claim 11, further comprising flowing inert gas into the second chamber prior to opening the gate valve, wherein the flowing of inert gas into the second chamber is discontinued immediately prior to opening the gate valve.

14. The method of claim 13, further comprising generating an inert gas curtain at a side of the gate valve adjacent the first chamber.

15. The method of claim 14, wherein the inert gas curtain is generated by inert gas jets in the first chamber directed towards the second chamber along a perimeter wall of the gate valve.

16. A method of transferring a semiconductor workpiece in a cluster tool for processing workpieces comprising a first chamber, a second chamber, and a gate valve positioned between the first chamber and the second chamber, the method comprising:
   operating a first pump to create a first pressure in the first chamber;
   operating a second pump to create a second pressure in the second chamber, wherein the second pressure is lower than the first pressure;
   isolating the first pump from the first chamber;
   flowing purge gas into the first chamber before isolating the first pump;
   opening the gate valve while the purge gas is flowing; and
   transferring the workpiece through the open gate valve between the first chamber and the second chamber.

17. The method of claim 16, further comprising flowing inert gas into the second chamber and discontinuing flowing the inert gas into the second chamber prior to opening the gate valve.

18. The method of claim 16, wherein the first pump is isolated from the first chamber at least 1 second before opening the gate valve.

19. The method of claim 16, wherein flowing purge gas into the first chamber is initiated at least 2 seconds prior to opening the gate valve.

20. The method of claim 16, wherein the second pump continues to operate while the gate valve is open.

* * * * *